United States Patent
Jang et al.

(10) Patent No.: US 9,465,259 B2
(45) Date of Patent: Oct. 11, 2016

(54) LIQUID CRYSTAL DISPLAY DEVICE

(71) Applicant: Samsung Display Co., Ltd., Yongin, Gyeonggi-Do (KR)

(72) Inventors: Chang-Soon Jang, Seoul (KR); Heera Kim, Seoul (KR); YiSeop Shim, Suwon-si (KR); Chul Huh, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/536,217

(22) Filed: Nov. 7, 2014

(65) Prior Publication Data
US 2015/0234224 A1    Aug. 20, 2015

(30) Foreign Application Priority Data

Feb. 18, 2014 (KR) .................. 10-2014-0018589

(51) Int. Cl.
*G02F 1/1339* (2006.01)
*H01L 27/12* (2006.01)

(52) U.S. Cl.
CPC ....... *G02F 1/13394* (2013.01); *H01L 27/1262* (2013.01); *G02F 2001/13396* (2013.01); *G02F 2001/13398* (2013.01)

(58) Field of Classification Search
CPC combination set(s) only.
See application file for complete search history.

(56) References Cited

U.S. PATENT DOCUMENTS

| | | | |
|---|---|---|---|
| 8,081,286 B2 | 12/2011 | Kim et al. | |
| 2009/0115954 A1* | 5/2009 | Tseng | G02F 1/13394 349/156 |
| 2009/0273747 A1 | 11/2009 | Shin et al. | |
| 2011/0013131 A1 | 1/2011 | Tanaka et al. | |
| 2011/0134060 A1* | 6/2011 | Sung | G06F 3/0412 345/173 |
| 2012/0281170 A1 | 11/2012 | Wu et al. | |
| 2014/0049717 A1 | 2/2014 | Kwak et al. | |
| 2014/0339937 A1* | 11/2014 | Tokunaga | H02K 5/225 310/71 |

FOREIGN PATENT DOCUMENTS

| | | | | |
|---|---|---|---|---|
| JP | WO 2013145426 A1 * | 10/2013 | ............. | H02K 5/225 |
| KR | 1020060069172 A | 6/2006 | | |
| KR | 1020080034545 A | 4/2008 | | |
| KR | 1020100075382 A | 7/2010 | | |

* cited by examiner

*Primary Examiner* — Mohammad Islam
*Assistant Examiner* — Ratisha Mehta
(74) *Attorney, Agent, or Firm* — Innovation Counsel LLP (57) ABSTRACT

Provided is an LCD device including a first substrate, a second substrate, a liquid crystal layer, a main spacer, and a supplementary spacer. The liquid crystal layer is interposed between the first and second substrates. The main spacer makes contact with the first and second substrates. The supplementary spacer makes contact with one of the first and second substrates and is spaced apart from the other. A first area ratio defined by dividing the area of a first top surface by that of a first bottom surface of the main spacer may be smaller than a second area ratio defined by dividing the area of a second top surface by that of a second bottom surface of the supplementary spacer.

6 Claims, 7 Drawing Sheets

LIQUID CRYSTAL DISPLAY DEVICE

CROSS-REFERENCE TO RELATED APPLICATIONS

This U.S. non-provisional patent application claims priority under 35 U.S.C. §119 to Korean Patent Application No. 10-2014-0018589, filed on Feb. 18, 2014, in the Korean Intellectual Property Office, the entire contents of which are hereby incorporated by reference.

BACKGROUND

Example embodiments of the inventive concept relate to a liquid crystal display (LCD) device, and in particular, to an LCD device including main and supplementary spacers, which support two substrates in different manners.

A LCD device may include two substrates facing each other, a liquid crystal layer interposed between the two substrates, and electrodes provided on the two substrates to generate an electric field. In the LCD device, images can be displayed by controlling orientations of liquid crystal molecules in the liquid crystal layer using the electric field. The LCD device may further include spacers provided between the two substrates to maintain a cell gap between the two substrates.

For LCD devices (e.g., tablet PCs) with a touch function, the LCD device should be durable enough to resist a pressure of a touch event repeatedly applied from a user.

SUMMARY

Example embodiments of the inventive concept provide an LCD device including main and supplementary spacers and having an improved display quality.

Other example embodiments of the inventive concept provide a method of fabricating the LCD device.

According to example embodiments of the inventive concept, an LCD device may include a first substrate, a second substrate, a liquid crystal layer, a main spacer, and a supplementary spacer. The first substrate may include a plurality of pixels, the second substrate may be provided to face the first substrate, and the liquid crystal layer may be interposed between the first and second substrates.

In example embodiments, the main spacer may be disposed between the first and second substrates and may make contact with both of the first and second substrates. Further, the main spacer may include a first top surface and a first bottom surface having an area larger than that of the first top surface. The supplementary spacer may be disposed between the first and second substrates. The supplementary spacer may make contact with one of the first and second substrates and be spaced apart from the other. Further, the supplementary spacer may include a second top surface and a second bottom surface having an area larger than that of the second top surface.

In example embodiments, a first area ratio, which is defined by dividing the area of the first top surface by that of the first bottom surface, may be smaller than a second area ratio, which is defined by dividing the area of the second top surface by that of the second bottom surface.

According to example embodiments of the inventive concept, a method of fabricating a liquid crystal display device may include forming a first substrate with a plurality of pixels, forming a second substrate, forming a liquid crystal layer between the first and second substrates, and forming a main spacer and a supplementary spacer between the first and second substrates.

In example embodiments, the main spacer may be formed to make contact with the first and second substrates and may have a first area ratio defined by dividing an area of a top surface thereof by an area of a bottom surface thereof, and the supplementary spacer may be formed to make contact with one of the first and second substrates and be spaced apart from the other and may have a second area ratio defined by dividing an area of a top surface thereof by an area of a bottom surface thereof. The first and second area ratios may be smaller than one, and the first area ratio may be smaller than the second area ratio.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
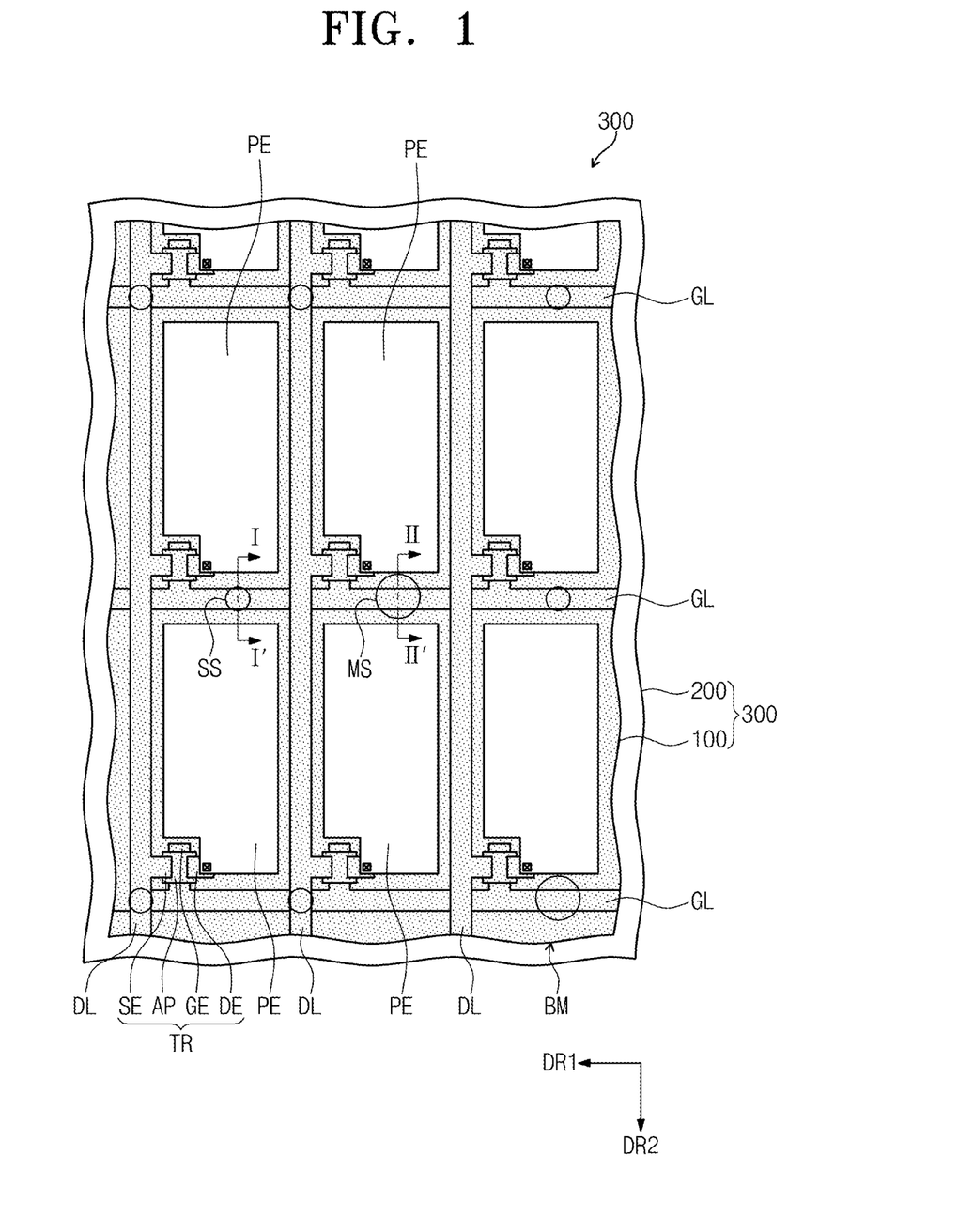
FIG. 1 is a plan view illustrating a plurality of pixels, which are provided in an LCD device according to example embodiments of the inventive concept.
Figure 2A:
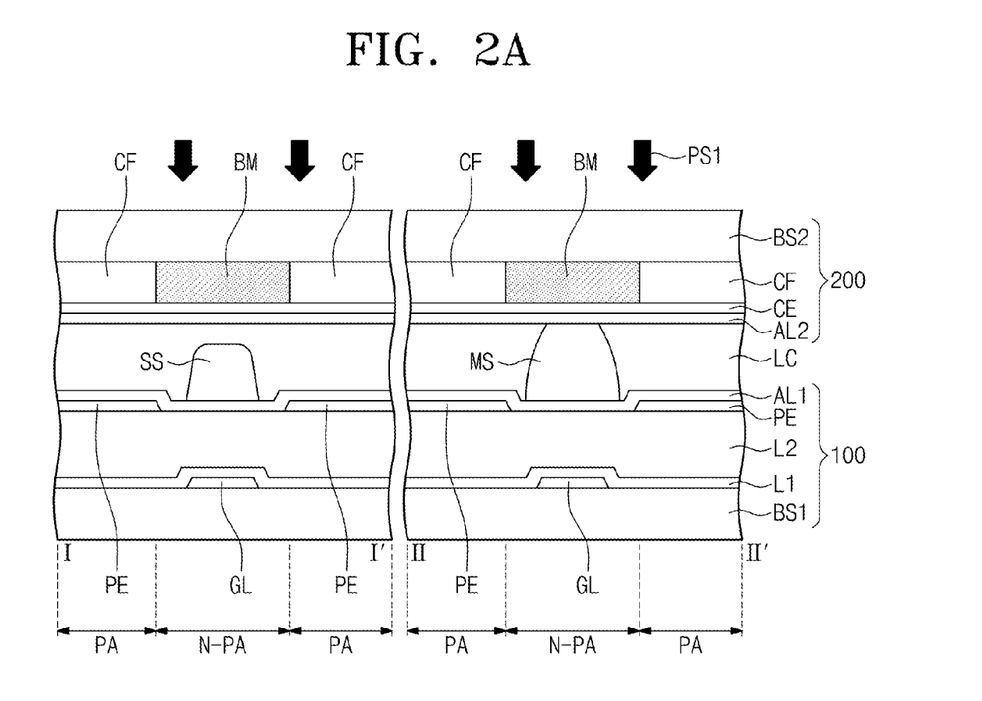
FIGS. 2A and 2B are sectional views taken along lines I-I' and II-II', respectively, of FIG. 1.
Figure 2B:
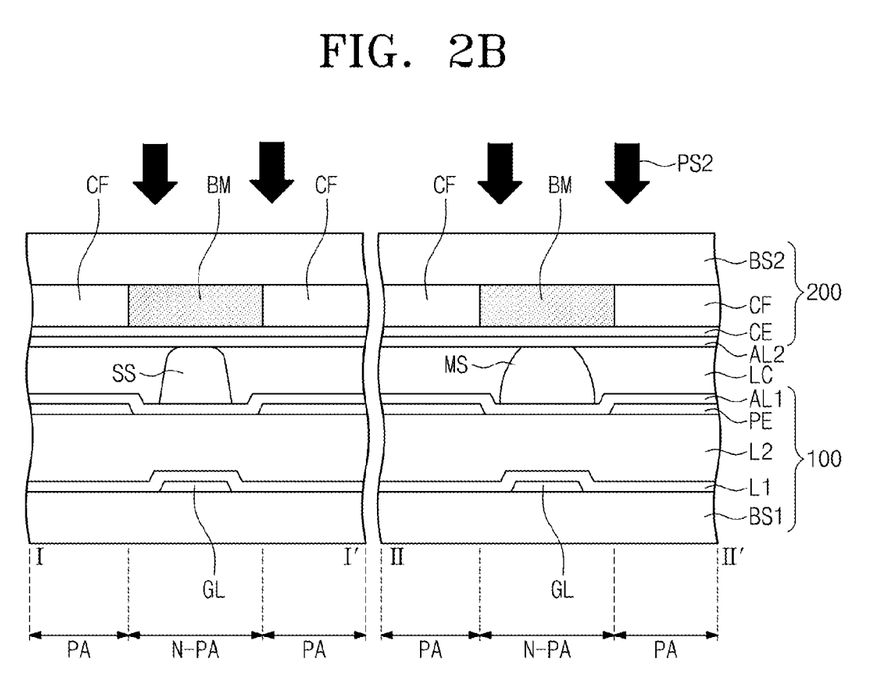

FIG. 1 is a plan view illustrating a plurality of pixels, which are provided in an LCD device 300 according to example embodiments of the inventive concept, and FIGS. 2A and 2B are sectional views taken along lines I-I' and respectively, of FIG. 1. In detail, FIG. 2A illustrates a section view of the LCD device 300, to which a first pressure PS1 is being exerted, and FIG. 2B illustrates a section view of the LCD device 300, to which a second pressure PS2 greater than the first pressure PS1 is being exerted.

Although the LCD device 300 has the plurality of pixels, some of the pixels will be exemplarily illustrated in and described with reference to FIG. 1. The remaining pixels may be configured to have the same or similar structure as that of the pixels described herein, and thus, the detailed description thereof will be omitted in the following description of FIGS. 1, 2A, and 2B.

Referring to FIG. 1, FIG. 2A, and FIG. 2B, the LCD device 300 may include a first substrate 100, a second substrate 200, a liquid crystal layer LC, a plurality of main spacers MS, and a plurality of supplementary spacers SS.

The first substrate 100 may include the plurality of pixels, the second substrate 200 may be coupled with the first substrate 100 to face the first substrate 100, and the liquid crystal layer LC may be provided between the first and second substrates 100 and 200. Although not shown in FIG. 1, the LCD device 300 may further include a backlight unit (not shown). The backlight unit may emit light toward the first and second substrates 100 and 200, and the light may be used to display images on the LCD device 300.

The first substrate 100 may include a first base substrate BS1, a plurality of gate lines GL, a plurality of data lines DL, a plurality of thin-film transistors TR, a first alignment layer AL1, and the plurality of pixels. In the present embodiment, the plurality of pixels may include a plurality of pixel electrodes PE.

The first base substrate BS1 may be a glass substrate or a plastic substrate. In the case where the first base substrate BS1 is the plastic substrate, the first base substrate BS1 may exhibit a flexible property.

Each of the gate lines GL may extend along a first direction DR1, and each of the data lines DL may extend along a second direction DR2 crossing the first direction DR1. In the present embodiment, the gate lines GL and the data lines DL may be disposed to cross each other and define a plurality of pixel regions PA, on which the pixel electrodes PE are respectively provided.

The plurality of thin-film transistors TR may be electrically connected to the plurality of pixel electrodes PE in a one-to-one manner. The thin-film transistors TR may be provided on a non-pixel region N-PA, and each of the thin-film transistors TR may include a gate electrode GE, an active pattern AP, a source electrode SE, and a drain electrode DE.

The gate electrode GE may be provided on the first base substrate BS1, and the active pattern AP may be provided on the gate electrode GE with a first insulating layer L1 interposed therebetween. When viewed in a plan view, the source electrode SE may be overlapped with the active pattern AP, and the drain electrode DE may be overlapped with the active pattern AP and be spaced apart from the source electrode SE.

The active pattern AP may include a semiconductor material (e.g., amorphous silicon). However, example embodiments of the inventive concept are not limited to a specific kind of the semiconductor material for the active pattern AP. For example, in certain embodiments, the active pattern AP may include at least one of oxide semiconductors (e.g., IGZO, ZnO, $SnO_2$, $In_2O_3$, $Zn_2SnO_4$, $Ge_2O_3$, and $HfO_2$) or compound semiconductors (e.g., GaAs, GaP, and InP).

The plurality of pixel electrodes PE may be provided on a second insulating layer L2, and each of them may be positioned on a corresponding one of the pixel regions PA. The pixel electrodes PE may be electrically connected to the thin-film transistors TR in a one-to-one manner, and the pixel electrodes PE, in conjunction with a common electrode CE, may produce an electric field for controlling orientations of liquid crystal molecules contained in the liquid crystal layer LC.

The first alignment layer AL1 may be provided on the first base substrate BS1 to cover the pixel electrodes PE. The first alignment layer AL1 may be configured to align orientations of the liquid crystal molecules in the liquid crystal layer LC to a specific direction. Orientations of the liquid crystal molecules aligned by the first alignment layer AL1 may be changed by adjusting an electric field produced between the pixel electrodes PE and the common electrode CE.

The second substrate 200 may include a second base substrate BS2, a light-blocking layer BM, a color filter CF, the common electrode CE, and a second alignment layer AL2. The second base substrate BS2 may be a glass substrate or a plastic substrate.

The light-blocking layer BM may be provided on the second base substrate BS2 to cover the non-pixel region N-PA, and the color filter CF may be provided on the second base substrate BS2 to face the pixel region PA. The light-blocking layer BM may be configured to prevent light transmitted through the liquid crystal layer LC from being propagated toward the non-pixel region N-PA, and the color filter CF may be configured to allow only a fraction with a specific wavelength of the light transmitted through the liquid crystal layer LC to be propagated toward the pixel region PA.

The common electrode CE may be provided on the second base substrate BS2 to cover the light-blocking layer BM and the color filter CF. The common electrode CE in conjunction with the pixel electrodes PE may be used to produce the electric field for controlling orientations of the liquid crystal molecules contained in the liquid crystal layer LC. The second alignment layer AL2 may be provided on the second base substrate BS2 to cover the common electrode CE and may be configured to align the orientations of the liquid crystal molecules adjacent thereto to a specific direction.

Example embodiments of the inventive concept are not limited to the afore-described structures of the first and second substrates 100 and 200. For example, in other embodiments, the color filter CF may be provided on the first base substrate BS1 to face the pixel region PA, and the light-blocking layer BM may be provided on the first base substrate BS1 to face the non-pixel region N-PA. In still other example embodiments, the common electrode CE may be provided on the first base substrate BS1 in such a way that it is spaced apart from the pixel electrodes PE.

The main and supplementary spacers MS and SS may be provided on the non-pixel region N-PA, when viewed in a plan view, and between the first and second substrates 100 and 200, when viewed in a sectional view. In the present embodiment, the number of the main spacers MS may be smaller than that of the supplementary spacers SS. For example, in a specific region of the first substrate 100 including 360 pixel regions PA, the number of the main spacers MS is smaller than about 100, and the number of the supplementary spacers SS ranges from about 100 to 300.

Hereinafter, one of the main spacers MS and one of the supplementary spacers SS will be described in more detail.

The main and supplementary spacers MS and SS may be provided to be in contact with at least one of the first and second substrates 100 and 200, and this makes it possible to maintain constantly a cell gap between the first and second substrates 100 and 200. In example embodiments, a bottom surface of the main spacer MS may be in contact with the first substrate 100, and a top surface of the main spacer MS may be in contact with the second substrate 200. Owing to such disposition of the main spacer MS, the cell gap can be constantly preserved as shown in FIG. 2A, if the first pressure PS1 exerted to the LCD device 300 is smaller than a specific magnitude (e.g., the second pressure PS2).

A bottom surface of the supplementary spacer SS may be in contact with the first substrate 100, and a top surface of the supplementary spacer SS may be spaced apart from the second substrate 200. As shown in FIG. 2B, if the second pressure PS2 greater than the first pressure PS1 is applied to the LCD device 300 from the outside, the main spacer MS may be compressed, and a second top surface of the supplementary spacer SS may be in contact with the second substrate 200. Even in this case, the cell gap can be maintained to be larger than a specific thickness, owing to the presence of the supplementary and main spacers SS and MS.

According to the afore-described structures of the main and supplementary spacers MS and SS, the second pressure PS2 may be first absorbed by the main spacer MS, and the remaining pressure may be absorbed by the supplementary spacer SS. In other words, the second pressure PS2 may be absorbed in two stages or in a stepwise manner by the main and supplementary spacers MS and SS, and thus, the LCD device 300 can have an improved durability against the second pressure PS2.

In example embodiments, each of the main and supplementary spacers MS and SS may be configured to have a sectional area decreasing with increasing distance from the first substrate 100 or have a taper shape. In other embodiments, each of the main and supplementary spacers MS and SS may be configured to have a taper shape, whose sectional area decreases with increasing distance from the second substrate 200, and in this case, the supplementary spacer SS may be in contact with the second substrate 200 and be spaced apart from the first substrate 100.

In example embodiments, the main spacer MS may be softer than the supplementary spacer SS. In other words, the supplementary spacer SS may have a hard property, compared with the main spacer MS. As will be described in detail below, this feature of the main and supplementary spacers MS and SS makes it possible to improve the display quality of the LCD device 300.

According to example embodiments of the inventive concept, the main and supplementary spacers MS and SS may provide not only an ability to maintain constantly the cell gap between the first and second substrates 100 and 200 under the first and second pressures PS1 and PS2 (hereinafter, referred as to a "first function") but also another ability to relieve the first and second pressure PS1 and PS2 (hereinafter, referred as to a "second function"). Since the main spacer MS is softer than the supplementary spacer SS, the main spacer MS may be mainly used to achieve the second function, and the supplementary spacer SS may be mainly used to achieve the first function.

Since the main spacer MS has the soft property for the second function and the supplementary spacer SS has the hard property for the first function, the main and supplementary spacers MS and SS of the LCD device 300 make it possible to improve functions of robustly maintaining the cell gap as well as of buffering the first and second pressures PS1 and PS2.

Since the main spacer MS is always in contact with the first and second substrates 100 and 200 or the first and second alignment layers AL1 and AL2 and has the soft property, the main spacer MS may contribute to reduce the scratching phenomenon of the first and second alignment layers AL1 and AL2. Accordingly, it is possible to prevent side products, which are produced from the first and second alignment layers AL1 and AL2 by the scratching phenomenon, from flowing into the liquid crystal layer LC. Also it is possible to prevent the liquid crystal molecules of the liquid crystal layer LC from being unintentionally oriented by the scratching phenomenon and thereby to prevent the display quality of the LCD device 300 from being deteriorated.

In example embodiments, the main and supplementary spacers MS and SS may be formed by forming a photosensitive film and performing an exposure process to the photosensitive film. In this case, the softness of the main spacer MS, which is greater than that of the supplementary spacer SS, can be realized by adjusting an amount of light incident into the photosensitive film. This will be described in more detail with reference to FIGS. 4A through 4F.

The structure of each of the main and supplementary spacers MS and SS will be described in more detail below.

Figure 3A:
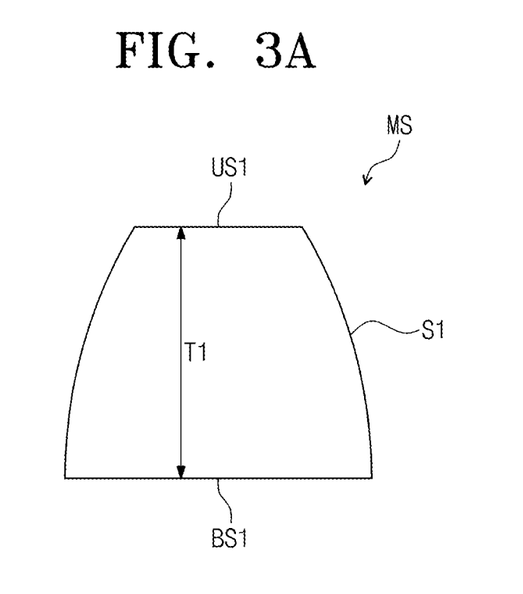
FIG. 3A is an enlarged view of a main spacer shown in FIG. 2A.
Figure 3B:
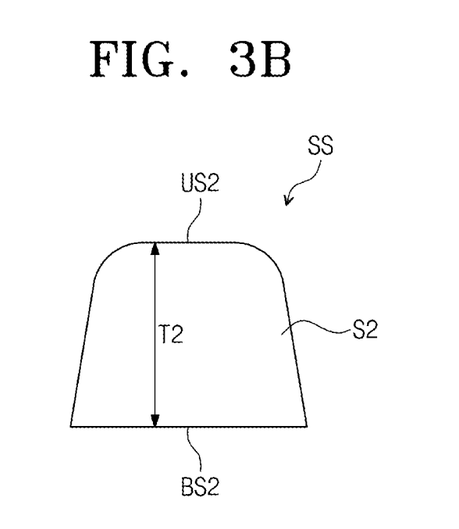
FIG. 3B is an enlarged view of a supplementary spacer shown in FIG. 2A.

FIG. 3A is an enlarged view of the main spacer MS shown in FIG. 2A, and FIG. 3B is an enlarged view of the supplementary spacer SS shown in FIG. 2A.

Referring to FIG. 3A and FIG. 3B, the main spacer MS may have a first top surface US1, a first bottom surface BS1, and a first side surface S1. The first bottom surface BS1 may have an area lager than that of the first top surface US1, and the first side surface S1 may be at an angle to the first top surface US1 and the first bottom surface BS1 and connect the first top surface US1 to the first bottom surface BS1.

The supplementary spacer SS may have a second top surface US2, a second bottom surface BS2, and a second side surface S2. The second bottom surface BS2 may have an area lager than that of the second top surface US2, and the second side surface S2 may be at an angle to the second top surface US2 and the second bottom surface BS2 and connect the second top surface US2 to the second bottom surface BS2.

A first thickness T1 of the main spacer MS may be greater than a second thickness T2 of the supplementary spacer SS. Accordingly, in the case where, as shown in FIG. 2A, the first and second bottom surfaces BS1 and BS2 are provided on the display substrate 100 to be coplanar with each other, a position of the first top surface US1 is higher than that of the second top surface US2, when measured from the display substrate 100.

In certain embodiments, the main and supplementary spacers MS and SS may be configured in such a way that a first area ratio is smaller than a second area ratio, where the first area ratio is given by dividing an area of the first top surface US1 by an area of the first bottom surface BS1, and the second area ratio is given by dividing an area of the second top surface US2 by an area of the second bottom surface BS2. For example, in the present embodiment, the first area ratio may range from about 38% to about 44%, and the second area ratio may range from about 45% to about 52%. Since the first area ratio is smaller than the second area ratio, the first side surface S1 may have a curvature greater than that of the second side surface S2. By contrast, in the case where the first area ratio is greater than the second area ratio, the main spacer MS may be mainly used to achieve the first function described with reference to FIGS. 2A and 2B, and the supplementary spacer SS may be mainly used to achieve the second function. Accordingly, the scratching phenomenon of the first and second alignment layers AL1 and AL2 caused by the main spacer MS may be significantly increased, and a property of maintaining the cell gap may be deteriorated.

In certain embodiments, the first and second area ratios may be different from each other to realize the main spacer MS that is softer than the supplementary spacer SS in terms of structure and fabrication method. This will be described in more detail with reference to FIGS. 4A through 4F.

FIGS. 4A through 4F are sectional views exemplarily illustrating a method of fabricating the LCD device of FIG. 2A. In the following description of FIGS. 4A through 4F, a previously described element may be identified by a similar or identical reference number without repeating an overlapping description thereof, for the sake of brevity.

Figure 4A:
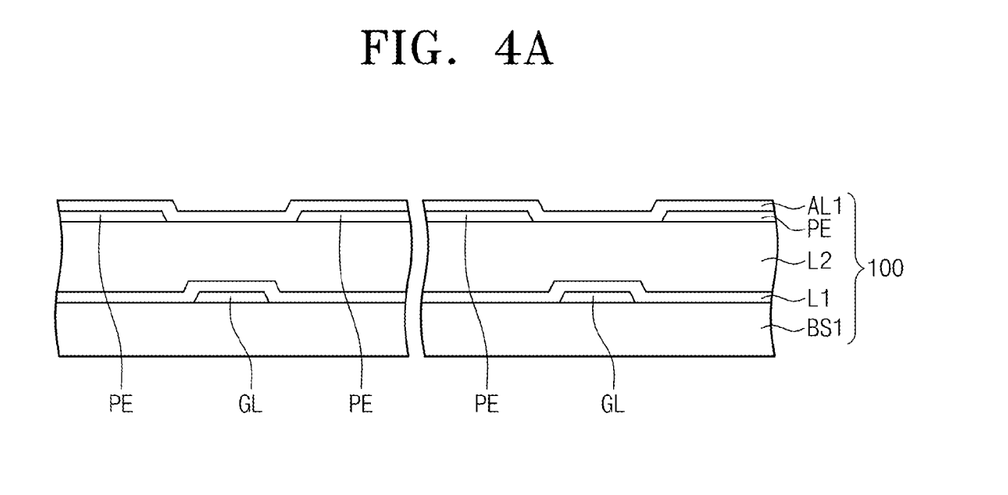
FIGS. 4A, 4B, 4C, 4D, 4E, 4F are sectional views exemplarily illustrating a method of fabricating the LCD device of FIG. 2A.

Referring to FIG. 4A in conjunction with FIG. 1, the first substrate 100 may be fabricated. The formation of the first substrate 100 may include forming the plurality of pixel electrodes PE, the plurality of thin-film transistors TFT, the plurality of gate lines GL, the plurality of data lines DL, and the first alignment layer AL1 on the first base substrate BS1. Example embodiments of the inventive concept are not limited to a specific method of fabricating the first substrate 100, and further, the first substrate 100 may be fabricated using a method for fabricating an array substrate of the conventional LCD device. Accordingly, a detailed description about a fabricating method of the first substrate 100 will be omitted.

Figure 4B:
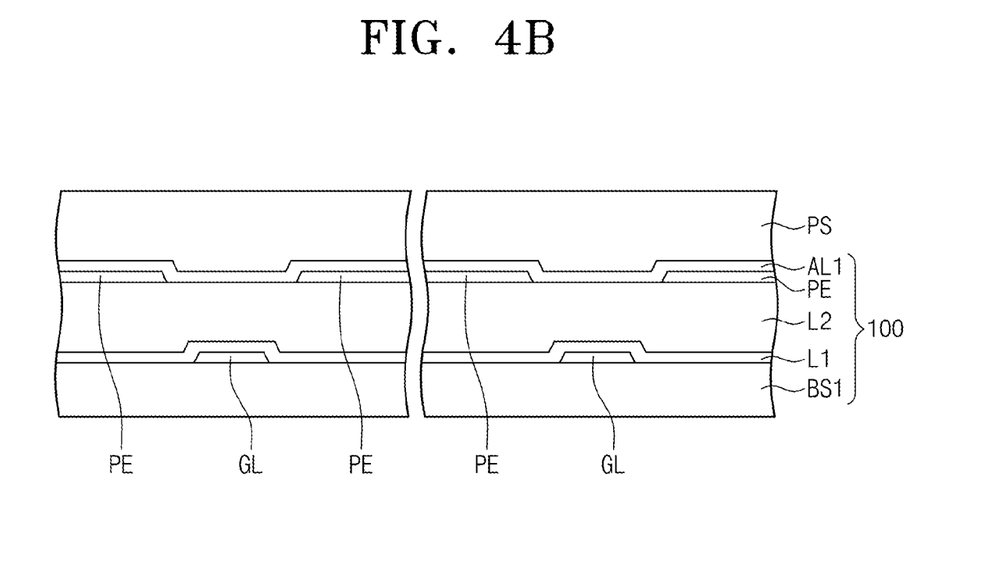
Figure 4C:
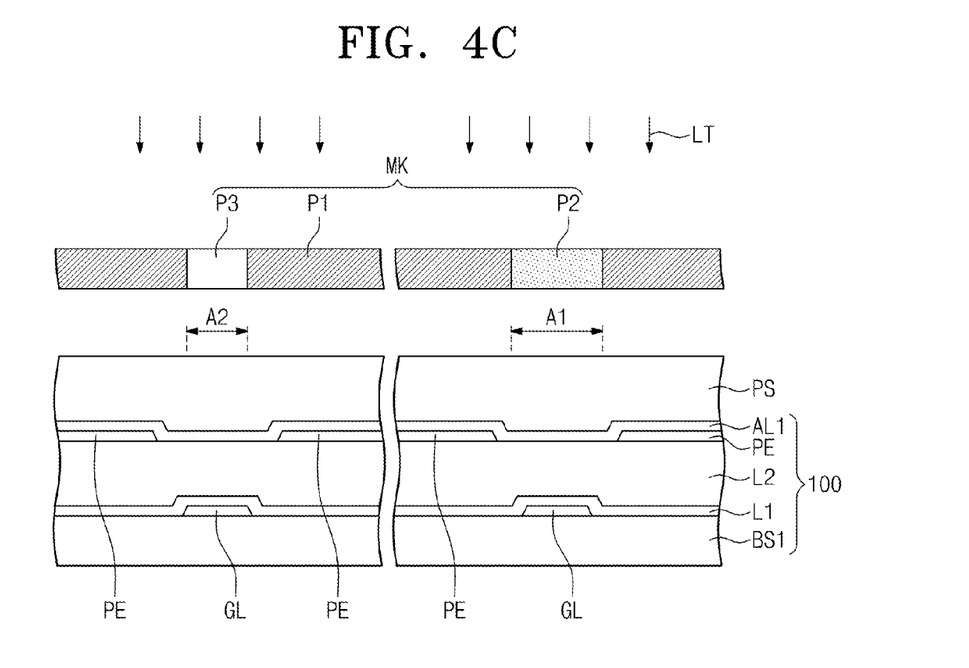

Referring to FIG. 4B and FIG. 4C, a photosensitive film PS may be formed on the first substrate 100. In example embodiments, the photosensitive film PS may be of a positive type. The photosensitive film PS may be used to form the main and supplementary spacers MS and SS and may have a thickness that is equal to or greater than that of the main spacer MS.

Thereafter, a mask MK may be disposed on the first substrate 100 with the photosensitive film PS, and then, light LT may be exposed onto the photosensitive film PS using the mask MK as a photomask. In example embodiments, the mask MK may include a light-blocking portion P1, a semitransparent portion P2, and a transparent portion P3. The mask MK may be disposed in such a way that the semitransparent portion P2 is aligned with a first region A1 of the photosensitive film PS, the transparent portion P3 is aligned with a second region A2 of the photosensitive film PS, and the light-blocking portion P1 is aligned with the remaining region of the photosensitive film PS other than the first and second regions A1 and A2.

In example embodiments, as described with reference to FIG. 3A and FIG. 3B, the first thickness T1 of the main spacer MS may be greater than the second thickness T2 of the supplementary spacer SS, the first bottom surface BS1 of the main spacer MS may be greater than the second bottom surface BS2 of the supplementary spacer SS. Accordingly, the first region A1 may have an area that is greater than that of the second region A2, and the semitransparent portion P2 may have an area that is greater than that of the transparent portion P3.

The light-blocking portion P1 may prevent the light LT from passing therethrough, and the transparent portion P3 may allow the light LT to pass therethrough. The semitransparent portion P2 may allow a fraction of the light LT to pass therethrough and prevent other fraction of the light LT from passing therethrough. Accordingly, an amount of the light LT per unit area, passing through the semitransparent portion P2 (hereinafter, referred as to a "first intensity") may be smaller than that passing through the transparent portion P3 (hereinafter, referred as to a "second intensity").

In other words, during the exposure process using the mask MK as the photo mask, the first and second regions A1 and A2 may be irradiated with lights of the first and second light densities, respectively. In the case where the photosensitive film PS is of the positive type and the first intensity is smaller than the second intensity, the photosensitive film PS may be easily or rapidly hardened at a portion corresponding to the second region A2, compared with other portion corresponding to the first region A1. Accordingly, after the exposure process, the portion of the photosensitive film PS corresponding to the first region A1 may be softer than other portion of the photosensitive film PS corresponding to the second region A2.

Figure 4D:
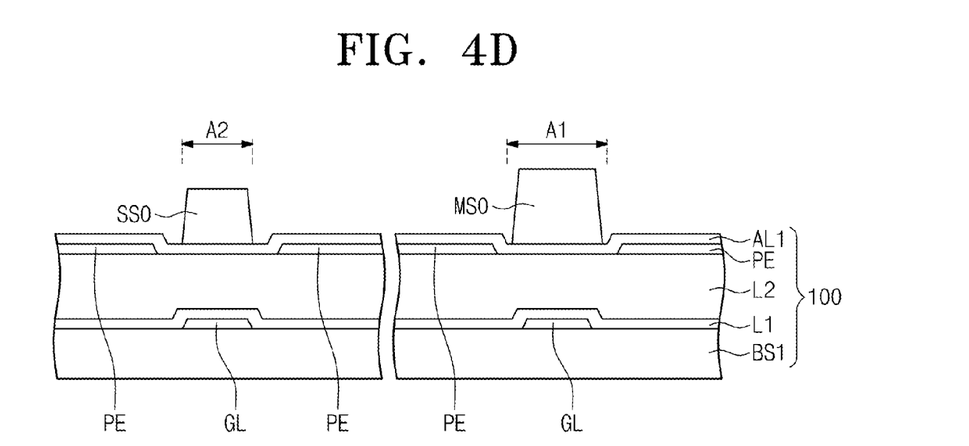
Figure 4E:
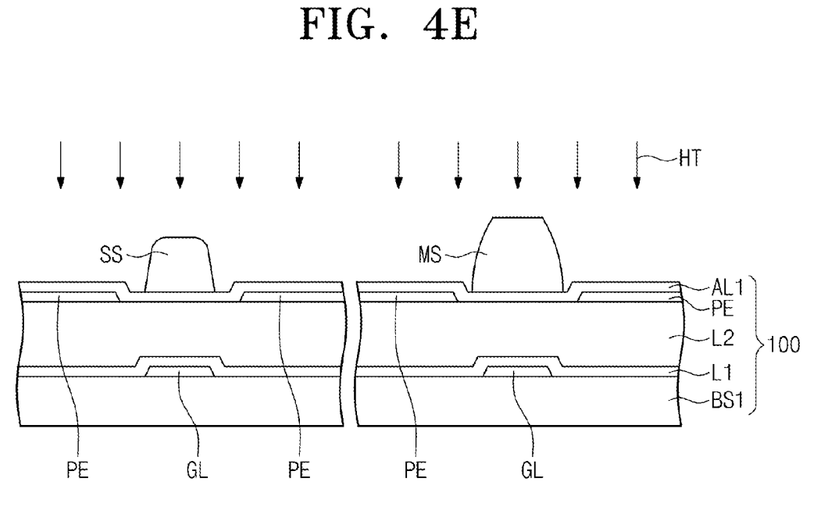

Referring to FIGS. 4D and 4E, after the exposure process, a development process may be performed to the photosensitive film PS to remove an unexposed portion of the photosensitive film PS. As the result of the development process, a first preliminary spacer MS0 may be formed on the first region A1, and a second preliminary spacer SS0 may be formed on the second region A2.

As described with reference to FIG. 4C, the first intensity for the first region A1 may be smaller than the second intensity for the second region A2, and in this case, a degree of the hardening of the first preliminary spacer MS0 may be smaller than that of the second preliminary spacer SS0. In other words, the first preliminary spacer MS0 may be softer than the second preliminary spacer SS0.

Thereafter, a thermal treatment process may be performed to apply heat HT to the first and second preliminary spacers MS0 and SS0. During the thermal treatment process, the first and second preliminary spacers MS0 and SS0 may be reflowed by the applied heat HT to form the main and supplementary spacers MS and SS, whose shapes are different from those of the first and second preliminary spacers MS0 and SS0. For example, top portions of the first and second preliminary spacers MS0 and SS0 may flow down, and consequently, the main and supplementary spacers MS and SS may have different shapes from the first and second preliminary spacers MS0 and SS0. Further, since the first preliminary spacer MS0 is softer than the second preliminary spacer SS0, the first preliminary spacer MS0 may be more significantly transformed from its original shape, compared with the second preliminary spacer SS0.

As the result of the reflow phenomenon, the first side surface S1 of the main spacer MS and the second side surface S2 of the supplementary spacer SS may have finite curvature radii. In example embodiments, the first side surface S1 may have a curvature radius that is smaller than that of the second side surface S2. As a result, after the thermal treatment process, the first area ratio of the first main spacer MS may become smaller than the second area ratio of the supplementary spacer SS, as described with reference to FIG. 3A and FIG. 3B.

Figure 4F:
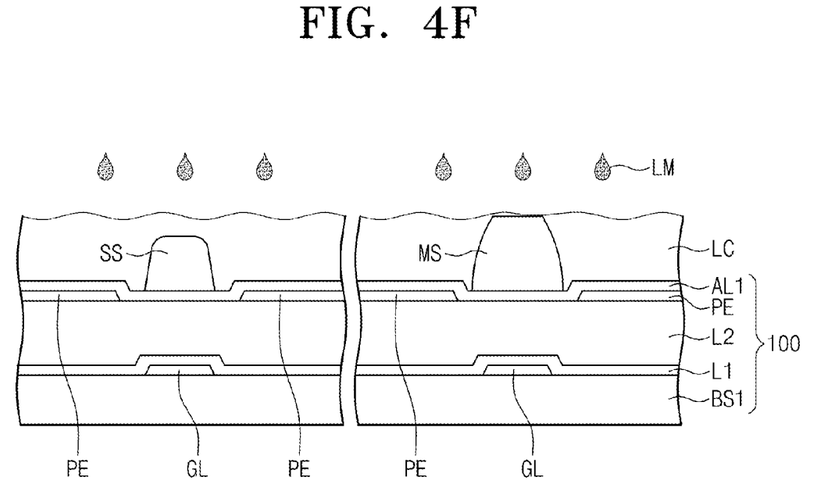

Referring to FIG. 4F, a droplet LM containing liquid crystal molecules may be supplied on the first substrate 100 provided with the main and supplementary spacers MS and SS to form the liquid crystal layer LC containing the liquid crystal molecules.

The first substrate 100 provided with the liquid crystal layer LC may be coupled with the second substrate 200, which may be fabricated in a different process.

As described above, the main spacer MS may be softer than the supplementary spacer SS. The main spacer MS may relieve or buffer a pressure to be applied to the LCD device from the outside, and moreover, the main spacer MS makes it easy to secure a thickness margin of the liquid crystal layer LC provided on the first substrate 100.

In the case where a cell gap between the first substrate 100 and the second substrate is filled with the liquid crystal layer LC, an amount of the droplet LM supplied on the first substrate 100 should be exactly controlled to prevent the liquid crystal layer LC from insufficiently filling the cell gap, because of a technical difficulty associated with the thermal expansion of the liquid crystal layer LC. For example, as an environment temperature decreases, the cell gap may be not filled with the liquid crystal layer LC. In other words, there is a difficulty in controlling the thickness margin of the liquid crystal layer LC. This difficulty may lead to a device failure, when the main spacer MS has an insufficient buffering function. By contrast, according to example embodiments of the inventive concept, since the buffering function of the main spacer MS is improved, it is possible to increase a process margin associated with the amount of the droplet LM and the thickness margin of the liquid crystal layer LC. This means that the process of supplying the droplet LM on the first substrate 100 can be easily performed, when compared with that of the conventional process.

According to example embodiments of the inventive concept, the main spacer MS may be configured to have a soft property, compared with the supplementary spacer SS, and moreover, the main and supplementary spacers MS and SS may be configured to have different area ratios. In certain embodiments, the supplementary spacer SS is configured in such a way that a cell gap between the first and second substrates 100 and 200 can be robustly preserved, and the main spacer MS is configured to more effectively relieve or buffer an external pressure.

Further, it is possible to prevent scratch phenomenon from occurring between the main spacer MS and the alignment layers AL1 and AL2 in contact with each other and thereby to prevent side products, which may be produced from the alignment layers AL1 and AL2 by the scratch phenomenon, from flowing into the liquid crystal layer LC. Accordingly, alignment of the liquid crystal molecules can be effectively controlled by the alignment layers AL1 and AL2, and the display quality of the LCD device can be prevented from being deteriorated by the scratch phenomenon.

Due to the buffering function of the main spacer MS, a thickness margin of the liquid crystal layer LC can be easily secured, and a process of forming the liquid crystal layer LC on the substrate 100 can be easily performed.

While example embodiments of the inventive concepts have been particularly shown and described, it will be understood by one of ordinary skill in the art that variations in form and detail may be made therein without departing from the spirit and scope of the attached claims.

What is claimed is:

1. A liquid crystal display (LCD) device, comprising:
   a first substrate having a plurality of pixels;
   a second substrate facing the first substrate;
   a liquid crystal layer interposed between the first and second substrates;
   a main spacer disposed between the first and second substrates and making contact with the first and second substrates, and the main spacer having a first top surface and a first bottom surface having an area larger than that of the first top surface; and
   a supplementary spacer disposed between the first and second substrates to make contact with one of the first and second substrates and be spaced apart from the other, and the supplementary spacer having a second top surface and a second bottom surface having an area larger than that of the second top surface,
   and the supplementary spacer being harder than the main spacer,
   wherein a first area ratio, which is defined by dividing the area of the first top surface by that of the first bottom surface, is smaller than a second area ratio, which is defined by dividing the area of the second top surface by that of the second bottom surface.

2. The device of claim 1, wherein the main spacer has a first side surface connecting the first top surface to the first bottom surface, and the supplementary spacer has a second side surface connecting the second top surface to the second bottom surface, wherein the first side surface has a curvature radius that is smaller than that of the second side surface.

3. The device of claim 2, wherein the first area ratio ranges from about 38% to about 44%, and the second area ratio ranges from about 45% to about 52%.

4. The device of claim 1, wherein the first and second bottom surfaces are in contact with the first substrate, the first top surface is in contact with the second substrate, and the second top surface is spaced apart from the second substrate.

5. The device of claim 1, wherein the supplementary spacer has a thickness that is smaller than that of the main spacer.

6. The device of claim 1, wherein each of the main and supplementary spacers is provided in plural numbers on a non-pixel region of the first substrate, and the number of the main spacers is smaller than the number of the supplementary spacers.

* * * * *